United States Patent
Schaller et al.

(10) Patent No.: US 7,309,654 B2
(45) Date of Patent: Dec. 18, 2007

(54) TECHNIQUE FOR REDUCING ETCH DAMAGE DURING THE FORMATION OF VIAS AND TRENCHES IN INTERLAYER DIELECTRICS

(75) Inventors: Matthias Schaller, Dresden (DE); Massud Aminpur, Crolles (FR); James Werking, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 11/380,094

(22) Filed: Apr. 25, 2006

(65) Prior Publication Data
US 2007/0004214 A1    Jan. 4, 2007

(30) Foreign Application Priority Data
Jun. 30, 2005    (DE)    ........... 10 2005 030 588

(51) Int. Cl.
*H01L 21/302* (2006.01)
(52) U.S. Cl. .............. 438/700; 438/638; 438/706; 438/735
(58) Field of Classification Search ........ 434/638, 434/640, 706, 710, 735
See application file for complete search history.

(56) References Cited
U.S. PATENT DOCUMENTS

| | | | |
|---|---|---|---|
| 5,562,801 A | 10/1996 | Nulty ............. | 156/21 |
| 6,103,619 A * | 8/2000 | Lai ............. | 438/638 |
| 6,352,921 B1 | 3/2002 | Han et al. ........ | 438/21 |
| 6,632,321 B2 | 10/2003 | Lill et al. ........ | 156/1 |
| 6,635,577 B1 | 10/2003 | Yamartino et al. ..... | 438/21 |
| 6,864,152 B1 | 3/2005 | Mirbedini et al. ..... | 438/21 |
| 6,893,969 B2 | 5/2005 | Ho et al. ........ | 438/21 |
| 2005/0118800 A1 | 6/2005 | Brakensiek et al. ..... | 438/21 |
| 2005/0255695 A1* | 11/2005 | Shimada .......... | 438/637 |

FOREIGN PATENT DOCUMENTS

| | | |
|---|---|---|
| DE | 103 24 434 A1 | 1/2005 |
| EP | 1276147 A2 | 1/2003 |

\* cited by examiner

*Primary Examiner*—Lan Vinh
(74) *Attorney, Agent, or Firm*—Williams, Morgan & Amerson, P.C.

(57) ABSTRACT

By performing a first common etch process for forming a via opening and a delineation trench or open area in a metallization layer with different removal rates, the etch front in the delineation trench or open area may be delayed, thereby significantly reducing the probability of wafer arcing. Subsequently, the delineation trench or open area may be etched down to the respective etch stop layer in a further common etch process, during which a trench is formed above the via opening.

29 Claims, 7 Drawing Sheets

TECHNIQUE FOR REDUCING ETCH DAMAGE DURING THE FORMATION OF VIAS AND TRENCHES IN INTERLAYER DIELECTRICS

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material.

2. Description of the Related Art

In an integrated circuit, a very large number of circuit elements, such as transistors, capacitors, resistors and the like, are formed in or on an appropriate substrate, usually in a substantially planar configuration. Due to the large number of circuit elements and the required complex layout of advanced integrated circuits, the electrical connections of the individual circuit elements are generally not established within the same level on which the circuit elements are manufactured. Typically, such electrical connections are formed in one or more additional "wiring" layers, also referred to as metallization layers. These metallization layers generally include metal-containing lines, providing the inner-level electrical connection, and also include a plurality of inter-level connections, also referred to as vias, filled with an appropriate metal. The vias provide electrical connection between two neighboring stacked metallization layers, wherein the metal-containing lines and vias may also be commonly referred to as interconnect structures.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers may increase and the dimensions of the individual lines and vias may be reduced as the number of circuit elements per chip area becomes larger. The fabrication of a plurality of metallization layers entails extremely challenging issues to be solved, such as mechanical, thermal and electrical reliability of a plurality of stacked metallization layers. As the complexity of integrated circuits advances and brings about the necessity for conductive lines that can withstand moderately high current densities, semiconductor manufacturers are increasingly replacing the well-known metallization metal aluminum with a metal that allows higher current densities and hence allows a reduction in the dimensions of the interconnections and thus the number of stacked metallization layers. For example, copper and alloys thereof are materials that are used to increasingly replace aluminum due to their superior characteristics in view of higher resistance against electromigration and significantly lower electrical resistivity when compared with aluminum. Despite these advantages, copper and copper alloys also exhibit a number of disadvantages regarding the processing and handling in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called damascene technique (single and dual) is therefore preferably used wherein a dielectric layer is first applied and then patterned to receive trenches and/or vias, which are subsequently filled with copper or copper alloys.

Figure 1A:
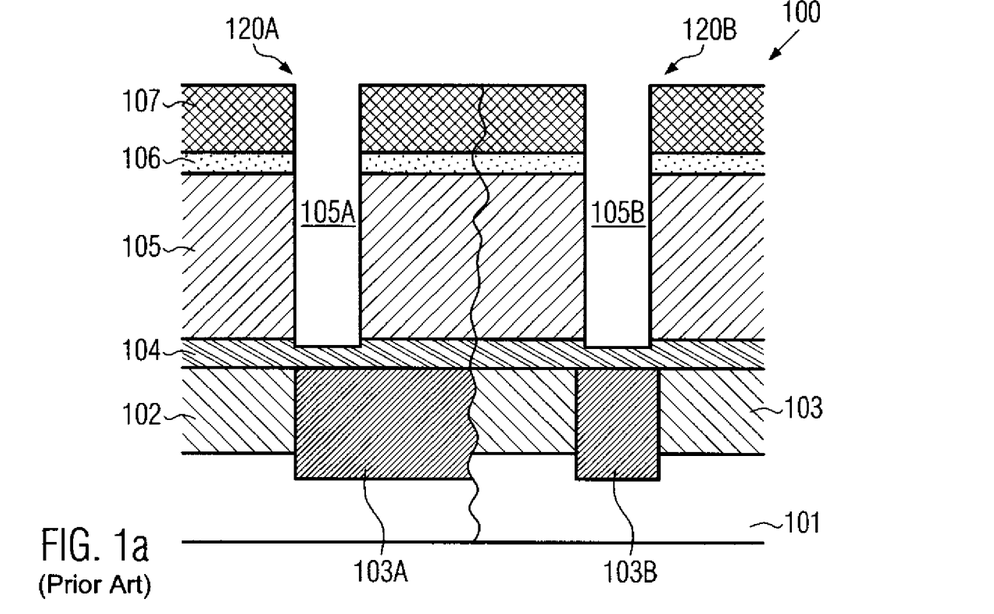
FIGS. 1a-1c schematically show cross-sectional views of a semiconductor device during the formation of vias and delineation trenches and open areas in a metallization layer during various manufacturing stages in accordance with a conventional process flow.
Figure 1B:
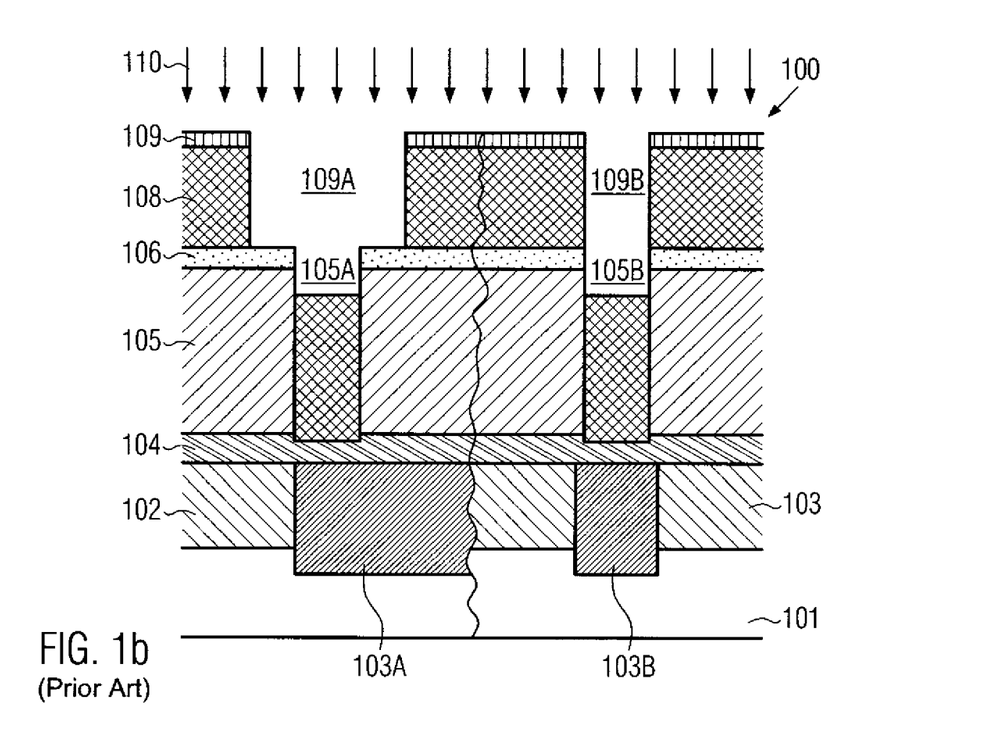
Figure 1C:
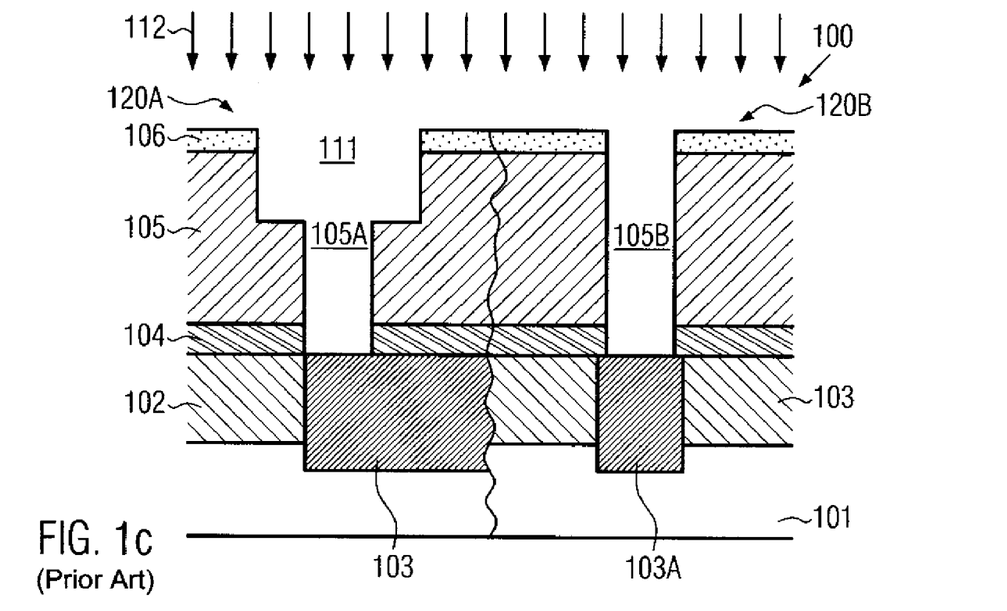

It turns out that the process of etching vias and trenches in the dielectric layer according to the damascene regime may significantly affect the overall production yield during the formation of advanced semiconductor devices having copper-based metallization layers owing to substrate damage caused by plasma-assisted etch processes. With reference to FIGS. 1a-1c, a typical conventional process flow will now be described in more detail so as to more clearly demonstrate the problems involved in forming highly scaled metal lines in a dielectric material according to a dual damascene process, in which vias are formed prior to corresponding trenches connected to the vias, wherein this approach is often called "via first trench last" approach.

FIG. 1a schematically shows a cross-sectional view of a semiconductor device 100 comprising a substrate 101, which may be provided in the form of a bulk silicon substrate, a silicon-on-insulator (SOI) substrate and the like, wherein the substrate 101 may also represent a device layer having formed therein individual circuit elements, such as transistors, capacitors, lines, contact portions and the like. For convenience, any such circuit elements are not shown in FIG. 1a. The device 100 comprises a first die region 120A and a second die region 120B, wherein the first die region 120A may represent an "inner" region that receives metal lines and vias, whereas the second die region 120B may represent a die seal region, a measurement region and the like, which is to receive a metal formed of continuously stacked metal regions so as to delineate, when the second die region represents a delineation trench, the first die region 120A from the second die region 120B. The device 100 further comprises a dielectric layer 102 formed above the substrate 101, wherein the layer 102 may represent a dielectric material enclosing the individual circuit elements, also referred to as contact layer, or the layer 102 may represent a portion of a lower lying metallization layer, in which any metal-filled vias (not shown) may be embedded. Depending on the specific design of the device 100, or the function of the layer 102, it may be comprised of a conventional dielectric material such as silicon dioxide, silicon nitride, or may comprise a low-k dielectric material such as, for instance, hydrogen enriched silicon oxycarbide (SiCOH). A metal line 103A is formed within the first die region 120A and above the substrate 101 and at least partially within the layer 102. The metal line 103A may be comprised of a copper-containing metal including conductive barrier layers (not shown) so as to enhance adhesion of the metal line to the surrounding material and reduce diffusion of copper into sensitive device regions. Moreover, a second metal line 103B is formed within the second die region 120B, which may be comprised of the same metal as the metal line 103A. An etch stop layer 104 is formed on the dielectric layer 102 and the metal lines 103A and 103B, wherein the etch stop layer 104 may be comprised of a material that exhibits a high etch selectivity to the material of a dielectric layer 105 formed on the etch stop layer 104. Furthermore, the etch stop layer 104 may also act as a diffusion barrier between the metal lines 103A, 103B and neighboring materials to reduce the out-diffusion of metal, such as copper, and diffusion of dielectric material into the metal lines 103A, 103B.

The dielectric layer 105, which may be comprised of a low-k dielectric material, is formed on the etch stop layer 104, followed by an ARC layer or capping layer 106, which may be formed from two or more sub-layers so as to achieve the desired performance with respect to the optical behavior, mechanical strength and masking characteristics. For instance, the capping layer 106 may be provided as a stack including a silicon dioxide layer, acting to impart improved mechanical strength to the layer 105 when formed of a low-k material, and a silicon oxynitride layer for adapting the optical behavior and a thin silicon dioxide layer acting as a nitrogen barrier for a resist mask 107 formed on the capping layer 106. The resist mask 107 includes a first opening 107A above the first die region 120A that corresponds to a via opening 105A for electrically connecting the metal line 103A with a metal line still to be formed in the dielectric layer 105. The resist mask 107 further comprises a trench 105B for connecting to the metal line 103B so as to finally establish a die seal for enclosing the first region 120A, or any other metallic enclosure of a specified die portion, such as a measurement region.

A typical process flow for forming the semiconductor device 100 as shown in FIG. 1a may comprise the following processes. After the completion of any circuit elements within the substrate 101, the dielectric layer 102 may be deposited by well-established deposition recipes based on plasma enhanced chemical vapor deposition (PECVD). For example, the layer 102 may be comprised of silicon dioxide, fluorine-doped silicon dioxide or SiCOH and hence deposition recipes on the basis of appropriate precursors may be employed to form the layer 102. Then the metal lines 103A, 103B may be formed in accordance with processes as will be described in the following with reference to the layer 105. Thereafter, the etch stop layer 104 is deposited by, for instance, well-established PECVD with a thickness that is sufficient to reliably stop a via and trench etch process to be performed later on. Next, the dielectric layer 105 is formed by chemical vapor deposition (CVD) or spin coating, depending on the material used. Then, the capping layer 106 is formed by PECVD techniques on the basis of well-established recipes to provide the desired characteristics in the further processing of the device 100. Finally, the resist mask 107 may be formed by advanced photolithography to form the respective openings 107A, 107B. Thereafter, an anisotropic etch process is performed, wherein, in an initial phase, the exposed portion of the layer 106 is removed and, in a subsequent process, the dielectric material of the layer 105 is removed to form the openings 105A, 105B. During this anisotropic plasma etch process, etch-specific phenomena, called "wafer arcing," may randomly occur, thereby generating burned metal and "worm-like" arcing marks, mainly along the edge of the substrate 101 and the metal line 103B, which may represent a metallic boundary for enclosing the first die region 120A. Thus, the frequency of the wafer arcing events significantly affects the yield per substrate, as such a wafer arcing event may result in a complete failure of one or more die regions. It is assumed that this frequency is substantially determined by plasma instabilities and by surface structure conditions, such as the topology, the pattern density, the presence of underlying metal lines, etc. For instance, research seems to indicate that the frequency of wafer arcing events during dielectric etch processes may be extremely low for front end processes and may significantly increase for back end processes when a plurality of metallization layers is already present, wherein in particular the via formation in the dual damascene approach tends to have a high probability for wafer arcing. Thus, after completion of the above-described etch process, one or more of the die regions 120B may have experienced a wafer arcing event, thereby typically rendering the corresponding die region 120A non-useable.

FIG. 1b schematically illustrates the device 100 in an advanced manufacturing stage. The device 100 now comprises a resist mask 109 having formed therein a trench 109A above the via opening 105A with dimensions corresponding to design dimensions of a trench to be formed above and around the via opening 105A. The resist mask 109 further comprises a trench 109B formed above the trench opening 105B in accordance with the dimensions thereof. Moreover, a fill material 108 is formed underneath the resist mask 109, wherein the fill material 108 is also provided within the openings 105A and 105B. The fill material may be comprised of a photoresist of different type compared to the resist mask 109, or the fill material 109 may represent any other polymer material that may be applied in a low viscous state so as to fill the openings 105A and 105B while providing a substantially planar surface. The fill material 108 may also serve as an ARC layer during the patterning of the resist mask 109.

The resist mask 109 may be formed by first applying the fill material 108 by, for example, spin-coating a resist or a polymer material, then applying a photoresist by spin coating, performing a well-established photolithography process and etching or dry-developing the fill material 108 on the basis of the resist mask 109. Thereafter, the device 100 is subjected to an etch ambient 110 on the basis of carbon and fluorine to etch through the layer 106 and remove a portion of the layer 105 to form a trench around the via opening 105A while the resist mask 109 and the fill material 108 at the trench opening 105B prevent substantial material removal. Moreover, the fill material 108 within the openings 105A and 105B, although also partially removed during the etch process 110, protects the remaining etch stop layer 104 so that the metal lines 103A and 103B are not exposed to the etch ambient 110. After a trench of specified depth is formed around the via opening 105A, the resist mask 109 and the fill material 108 are removed by, for instance, an oxygen-based plasma treatment.

FIG. 1c schematically shows the device after the above process sequence with a trench 111 formed in the layer 106 and the dielectric layer 105 around the via opening 105A. Moreover the device is subjected to a further etch process 112 to remove the remaining etch stop layer 104.

The via opening 105A, the trench 111 and the trench 105B may then be filled with metal, such as copper, copper alloys, by electrochemical deposition techniques, wherein, prior to the electrochemical deposition, corresponding barrier and seed layers may be formed. As pointed out above, during the formation of the metal-filled via 105A and the trench 111 in the first die region 120A and the trench 105B in the second die region 120B, an increased risk for wafer arcing may result, in particular during the etch process for forming the via 105A. Moreover, the risk for wafer arcing may still increase for each further metallization layer that is to be formed above the layer 105, thereby significantly reducing production yield.

In view of the situation described above, there exists a need for an improved technique which solves or at least reduces the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of vias and delineation trenches and/or open areas in a interlayer dielectric of metallization layers by means of an etch process, in which the etch front for the vias and the delineation trenches and/or open areas does not simultaneously arrive at an underlying etch stop layer. Consequently, the probability for plasma-induced damage, such as wafer charging and wafer arcing, may significantly be reduced, thereby providing the potential for increasing etch yield.

According to one illustrative embodiment of the present invention, a method comprises forming a via opening and a delineation area in a dielectric layer of a metallization layer in a first common etch process, wherein the first common etch process is designed to have a first etch rate at the via opening and to have a second reduced etch rate at the delineation area. Moreover, the method comprises discontinuing the first common etch process when the via opening reaches an etch stop layer located below the dielectric layer. Finally, a trench connecting to the via opening is formed in an upper portion of the dielectric layer, and the delineation area is further deepened so as to extend to the etch stop layer in a second common etch process.

In accordance with another illustrative embodiment of the present invention, a method comprises establishing an etch recipe for a first common etch process for forming a via opening and at least one of a delineation trench and an open area in an interlayer dielectric of a metallization layer of a specified type of semiconductor device, wherein the first common etch process is designed to have a first etch rate at the via opening and to have a second reduced etch rate at the delineation trench and/or open area. Moreover, on one or more substrates, the via opening and the at least one of a delineation trench and an open area are formed on the basis of the established process recipe and the first common etch process is discontinued when the via opening reaches an etch stop layer located below the dielectric layer. Finally, the method comprises forming a trench, connecting to the via opening, in an upper portion of the dielectric layer and further deepening the at least one of a delineation trench and open area so as to extend to the etch stop layer according to a second common etch process.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is generally directed to a technique for forming metallization layers in accordance with a damascene strategy, in which vias are formed first and subsequently trenches are formed above the vias, wherein the formation of any delineation trenches, such as the formation of die seal regions and any other open areas, may be decoupled to a certain degree, while nevertheless maintaining a high compatibility to the standard process flow described with reference to FIGS. 1a-1c. It is believed that the delay of the etch front at delineation trenches and open areas during the via opening etch process may significantly reduce the risk of wafer arcing or any other plasma-induced wafer charging effects so that the yield per substrate during the formation of metallization layers in accordance with the damascene strategy may significantly be enhanced.

Figure 2A:
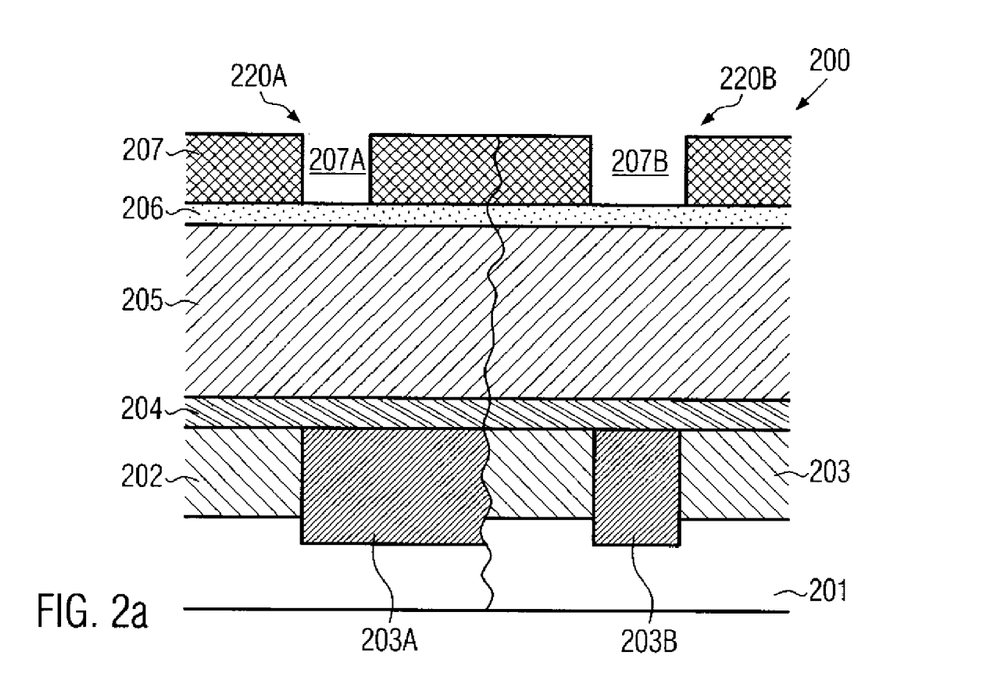
FIGS. 2a-2h schematically show cross-sectional views of a semiconductor device during various manufacturing stages in forming via openings and delineation trenches and/or open areas in a metallization layer, wherein a substantially simultaneous landing of the via opening etch front and the etch front within the delineation trench and/or open area is avoided in accordance with illustrative embodiments of the present invention.

With reference to FIGS. 2a-2h and 3a-3b, further illustrative embodiments of the present invention will now be described in more detail. FIG. 2a schematically shows a cross-sectional view of a semiconductor device 200 during a specified manufacturing stage in accordance with illustrative embodiments of the present invention. The semiconductor device 200 comprises a substrate 201, which may represent any appropriate substrate having formed thereon a semiconductor layer suitable for the formation of circuit elements, microstructures and the like. For convenience, any such circuit elements, such as transistors, capacitors and the like, as well as microstructures and the like, are not shown. The substrate 201 may represent in some embodiments a bulk silicon substrate having formed thereon an appropriate crystalline semiconductor layer, or in other embodiments the substrate 201 may represent an SOI substrate having formed thereon a semiconductor layer separated by a buried insulating layer, wherein this arrangement provides enhanced performance in terms of operating speed, radiation immunity and the like. It should be appreciated, however, that any other appropriate semiconductor material may be used wherein, in particular, in sophisticated applications, the substrate 201 may have formed therein crystalline regions of different crystallographic orientations and/or inherent strain and/or different material composition and the like.

The substrate 201 may comprise a first die region 220a, which may represent a region of the device 200 that includes a plurality of circuit elements and interconnect structures providing the electrical connections between the individual circuit elements. Moreover, a second die region 220b may be provided, which may represent a region that may include a boundary for the region 220a and/or any other so-called open areas for accommodating measurement regions and the like. In the embodiment shown, the second die region 220b may represent a region including a delineation trench that may be configured to provide a die seal for the first die region 220a.

The semiconductor device 200 further comprises a dielectric layer 202, which may represent a dielectric material that encloses any circuit elements in the form of a contact layer, or the layer 202 may represent an interlayer dielectric in which are formed a first metal line 203a within the first die region 220a and a second metal line 203b formed within the second die region 220b, wherein the metal line 203b may represent a portion of a metallic boundary of the die region 220a. In advanced semiconductor devices, the layer 202 may comprise a low-k dielectric material, wherein the term "low-k" is to be understood to indicate a material having a relative permittivity of 3.0 or less. In some exemplary embodiments, an appropriate low-k material may be hydrogenated silicon oxycarbide (SiCOH), whereas in other illustrative embodiments other suitable low-k polymer material may be used.

Formed above the layer 202 and the metal lines 203a, 203b is an etch stop layer 204, which may be comprised of silicon nitride, silicon carbide, nitrogen-enriched silicon carbide and the like. Next, a further dielectric layer 205 is formed on the etch stop layer 204. The dielectric layer 205 may be comprised of two or more sub-layers, wherein in sophisticated devices at least a portion of the dielectric layer 205 is comprised of a low-k dielectric material, such as SiCOH and the like. An anti-reflective coating (ARC) layer 206 is formed on the dielectric layer 205, wherein the layer 206 may have optical characteristics that significantly reduce back reflection during a subsequent photolithography process. For instance, the ARC layer 206 may be comprised of silicon nitride, silicon oxynitride, oxygen-enriched silicon carbide and the like, wherein the layer 206 may be comprised of two or more sub-layers of different material composition so as to meet specific process requirements. A resist mask 207 may be formed on the ARC layer 206 and may comprise an opening 207a representing the shape and size of a via opening to be formed in the dielectric layer 205. Moreover, the resist mask 207 may comprise a corresponding opening 207b, such as a trench opening or any other opening having a size and a dimension as is required for the second die region 220b. Generally, the dimensions of the opening 207b, at least in one direction, may significantly be greater than the corresponding dimensions of the opening 207a. For instance, if the opening 207b represents a delineation trench, its dimension in the length direction of the trench, i.e., in FIG. 2a the direction perpendicular to the drawing plane, is significantly larger than the corresponding dimension of the via opening 207a.

A typical process flow for forming the semiconductor device 200 as shown in FIG. 2a may comprise processes similar to those described with reference to FIG. 1a. Thus, the device 200 may be formed by any appropriate and well-established processes for manufacturing circuit elements, microstructures and the like within the substrate 201 in accordance with device requirements. Thereafter, electrical contacts may be formed to connect to at least some of the circuit elements formed in the substrate 201 in accordance with well-established processes. In other embodiments, the lines 203a, 203b may represent metal lines of a metallization layer which may have corresponding vias (not shown) to lower lying metallization layers or to any circuit elements. Thus, the dielectric layer 202 and the metal lines 203a, 203b may be formed in accordance with well-established damascene techniques in which the dielectric layer 202 is formed first and subsequently patterned so as to receive the metal for forming the lines 203a and 203b.

Thereafter, the etch stop layer 204 may be formed on the basis of well-established PECVD techniques and thereafter the dielectric layer 205 may be formed by PECVD and/or spin-on techniques and the like, depending on the type of material used. For instance, in illustrative embodiments, the dielectric layer 205 may comprise SiCOH, which may be formed in accordance with well-established PECVD techniques. Thereafter, the ARC layer 206 may be formed on the basis of a process recipe adapted to establish the required optical characteristics. Finally, the resist mask 207 is formed by depositing a corresponding resist layer and exposing the resist layer to a specified exposure wavelength. After the development of the exposed resist layer, the resist mask 207 is obtained having formed therein the openings 207a, 207b. In the embodiment shown in FIG. 2a, the resist mask 207 may be designed so as to act as an etch mask for etching through the ARC layer 206 and the dielectric layer 205, whereas in other embodiments the process for etching through the dielectric layer 205 may be performed on the basis of a hard mask layer, as will be described in more detail with reference to FIG. 2c.

Figure 2B:
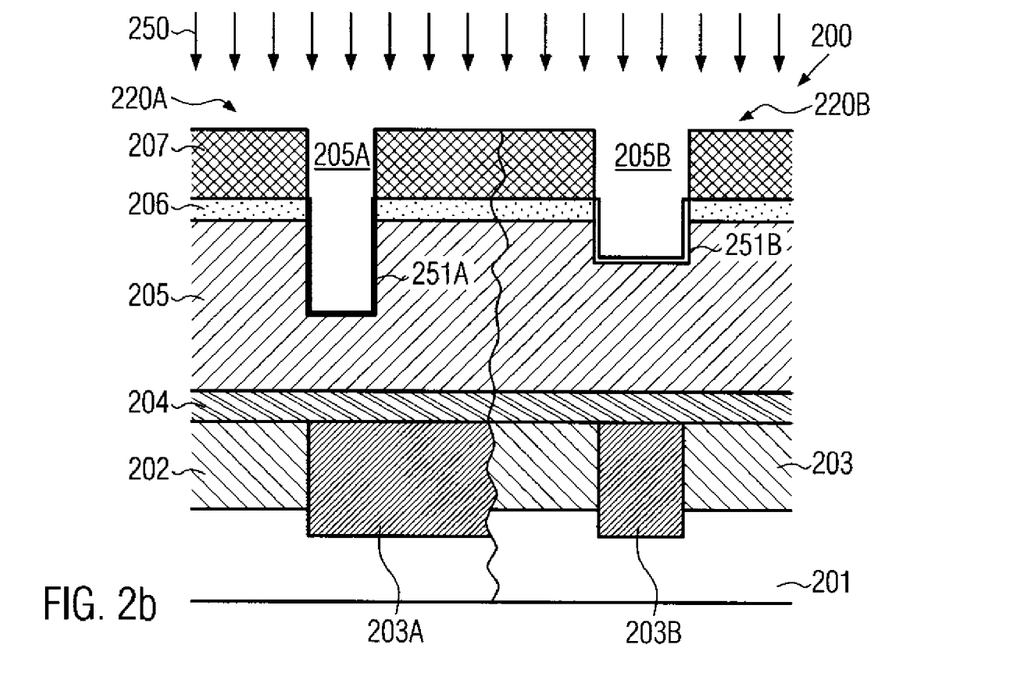

FIG. 2b schematically shows the semiconductor device 200 in a further advanced manufacturing stage, wherein the device 200 is subjected to an anisotropic etch process 250. The etch process 250 is typically a plasma-based etch process, in which ionic and neutral species synergetically provide moderate selective material removal in a highly anisotropic manner. A plasma is created therefor on the basis of carrier and precursor gases so as to form a mixture of reactive and non-reactive ionic and neutral particles that result in a more or less selective material removal on the basis of a chemical reaction and physical bombardment. Corresponding etch recipes for substantially anisotropically etching through a plurality of dielectric materials, such as silicon dioxide, silicon nitride, low-k materials such as SiCOH, and the like, are well established in the art. Typically, in conventional recipes, as is described for instance with reference to FIG. 1a, the etch rate at the opening 207a may be comparable to the etch rate at the trench 207b, except for microloading effects, so that the etch front may reach the etch stop layer 204 substantially simultaneously or, due to microloading effects, that is, a pattern-depending etch rate typically resulting in a reduced etch rate in tiny openings compared to wide trenches and openings, the etch front may reach the etch stop layer 104 (see FIG. 1a) first in the trench opening 105b, thereby providing a high probability for the occurrence of wafer arcing effects. Contrary thereto, the anisotropic etch process 250 is designed so as to exhibit a first etch rate at the opening 207a and a second reduced etch rate at the opening 207b, thereby resulting in a via opening 205a whose depth is significantly increased compared to that of a delineation trench opening 205b. For example, the etch process 250 may be designed so as to produce an inhibitor layer which may be comprised of etch by-products generated by a specific precursor material supplied to a plasma ambient of the process 250. For instance, oxygen, hydrogen, fluorine and the like may be added to the plasma ambient of the process 250 in order to generate corresponding inhibitor layers 251b and 251a in the corresponding openings 205b, 205a.

Although in principle the creation of inhibitor material may be defined by the flow rate of a corresponding precursor gas as well as the overall process parameters of the process 250, the inhibitor generation and thus deposition may be controlled such that the inhibitor layer 251b is more pronounced compared to the inhibitor layer 251a. To this end, for instance, the anisotropic component of the etch process 250, such as the degree of physical sputtering, may be enhanced, thereby providing a substantially equal etch rate at the bottoms of the openings 205b, 205a irrespective of their lateral size. On the other hand, the presence of particles promoting the creation of the corresponding inhibitor layers 251b, 251a may significantly be reduced in the opening 205a due to the significantly reduced dimensions compared to the opening 205b. Consequently, the inhibitor layer 251a may hinder any material removal of the layer 205 less efficiently compared to the opening 205b, thereby providing a significantly different etch rate during the formation of the corresponding openings 205a, 205b. It should be appreciated that other control strategies may be used so as to obtain a reduced etch rate for the formation of the opening 205b when etching the via opening 205a through the layer 205. A corresponding etch recipe may be obtained on the basis of test runs, in which a plurality of differently sized openings are etched into a layer that substantially corresponds to the layer 205, wherein one or more process parameters, such as the flow rate of specific precursors, the plasma energy, the bias energy, pressure, temperature and the like, may be varied in order to identify suitable process conditions for obtaining a reduced etch rate in openings of large dimensions compared to respective via openings. Once a suitable process parameter setting is established, the resulting process recipe may be used for a plurality of product substrates during the formation of the via opening 205a and the opening 205b by means of the anisotropic etch process 250.

It should be appreciated that the process 250 may involve two or more individual etch steps, wherein at least in one of these etch steps a reduced etch rate at the opening 205b compared to the opening 205a is obtained. For instance, the first etch step may be designed so as to etch through the ARC layer 206 and a second etch step or main etch step may be performed to etch through the layer 205. Hereby, the main etch step may be designed so as to create the required difference in etch depth between the openings 205a and 205b, wherein in some embodiments a reduced etch rate at the opening 205b may be obtained during the entire process or at least during a specified phase of the main etch process. When a variation of the etch rate is desired, one or more process parameters may be altered during the main etch step, for instance when a high etch selectivity is desired at the time the etch front within the opening 205a is approaching the etch stop layer 204. In this phase of the etch process 250, a reduced anisotropicity may be selected for the benefit of increased selectivity and a possible increase of etch rate within the opening 205b, for instance caused by the new process conditions, as long as a required delay between the two etch fronts is maintained.

Figure 2C:
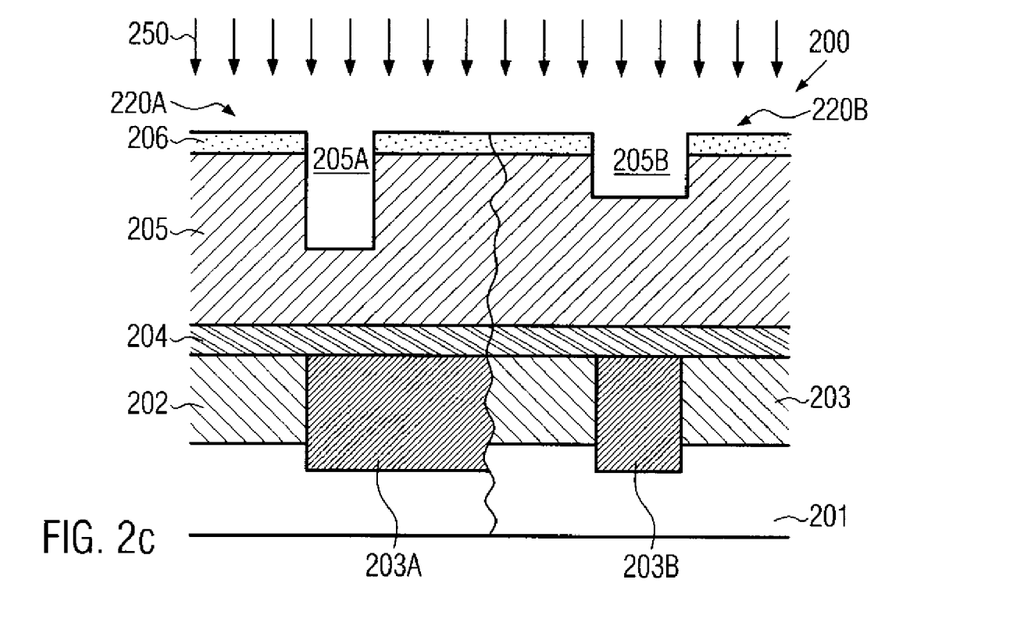

FIG. 2c schematically shows the semiconductor device 200 during the anisotropic etch process 250 in accordance with a further illustrative embodiment. In this embodiment, the resist mask 207 (see FIG. 2b) has been used for patterning the ARC layer 206, which is now also designed to act as a hard mask for the etch process 250 after removal of the resist mask 207. For this purpose, the ARC layer 206 may be deposited as a layer stack including two or more sub-layers which are designed to provide the required optical characteristics and also provide the required etch selectivity in etching through the layer 205. Providing the ARC layer 206 in the form of a hard mask layer allows enhanced flexibility in performing the photolithography for patterning the resist mask 207. For instance, in highly sophisticated applications, a 193 nm photolithography may be required, in which an appropriate photoresist material may have to be provided with a moderately low thickness. Consequently, a corresponding resist mask may not appropriately serve as an etch mask for etching through the layers 206 and 205. Thus, in the present approach, the resist mask 207 may be used for only patterning of the layer 206 and may be removed prior to the process 250. Based on the hard mask 206, the process 250 may be performed as is described with reference to FIG. 2b.

Figure 2D:
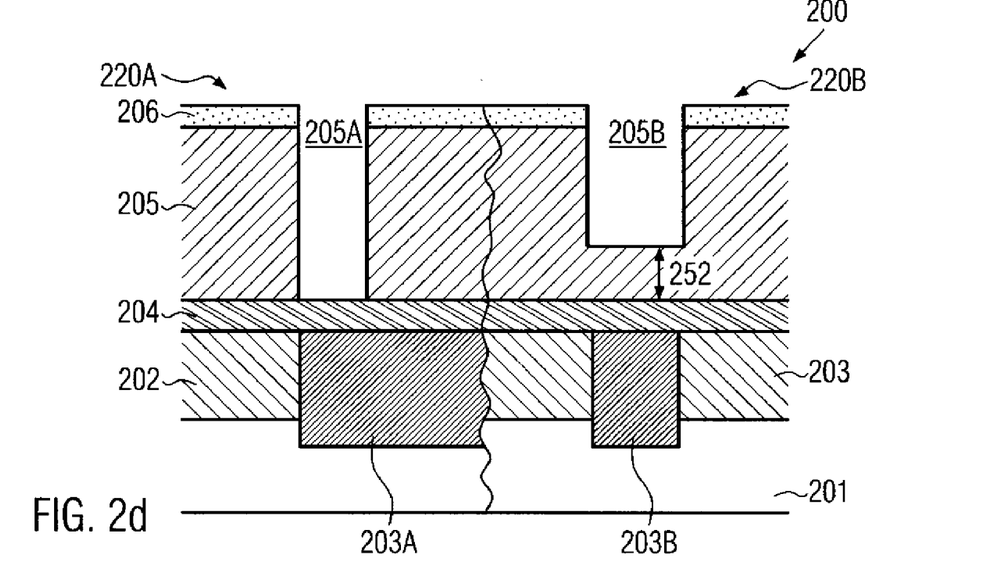

FIG. 2d schematically shows the device 200 after the completion of the etch process 250, that is, the via opening 205a extends down to the etch stop layer 204, whereas the opening 205b is still spaced apart from the etch stop layer 204 due to the reduced etch rate at least in a certain phase of the etch process 250. Thus, a distance 252 of the bottom of the opening 205b to the etch stop layer 204 is still provided, thereby reducing the risk of wafer charging or wafer arcing, especially during a final phase of the process 250, when the via opening 205a lands on the etch stop layer 204. Moreover, depending on the process strategy used, the resist mask 207 may have been removed when the process according to FIG. 2e has been performed, or the resist mask 207 may have been removed in an earlier stage, when the process strategy is followed as is described with reference to FIG. 2c. It should be appreciated that the distance 252 may be controlled on the basis of the process parameters of the process 250, which are selected to result in a reduced etch rate in the opening 205b. Hence, the distance 252 may be established in advance by corresponding test runs and corresponding measurement results, which may also have been performed and used for establishing a suitable process recipe for the process 250. It is preferable that the distance 252 be selected to be less than a depth of a trench that is to be formed in an upper portion of the layer 205 to connect to the via opening 205a. Consequently, a target value for the distance 252 may be selected to be less than a target value of the corresponding trench to be formed above the via opening 205a.

Figure 2E:
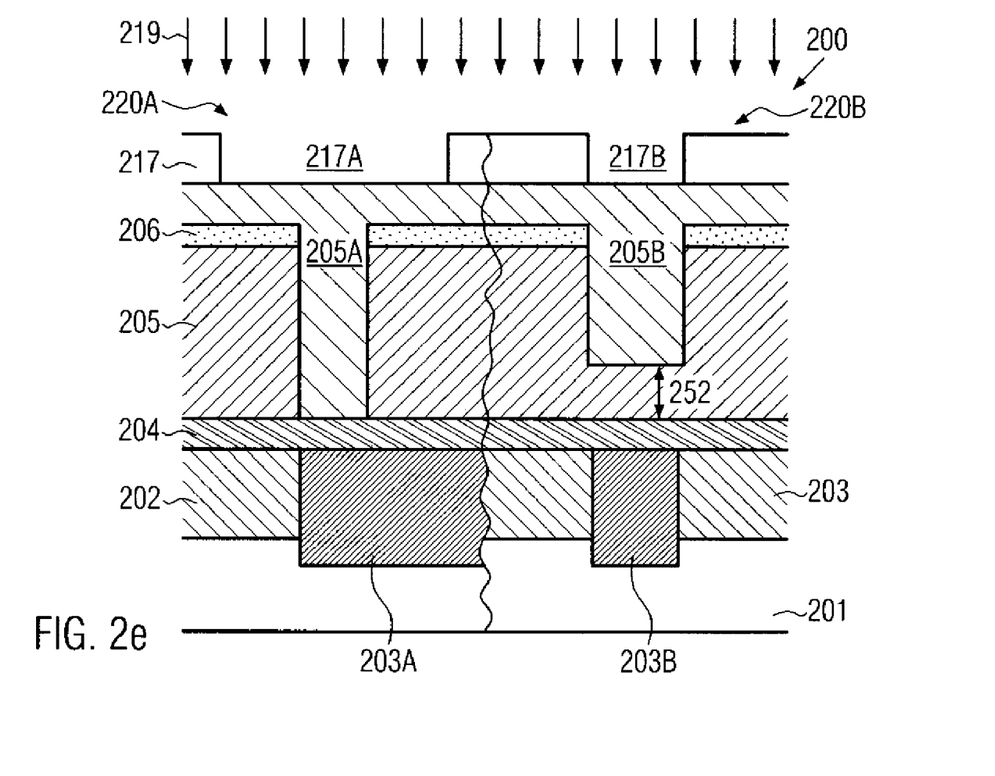

FIG. 2e schematically shows the device 200 in a further advanced manufacturing stage. The device 200 comprises a fill layer or underlayer 218 comprised of an appropriate fill material, which also fills the via opening 205a and the opening 205b. A fill material for forming the fill layer 218 may comprise any appropriate polymer material, which may be deposited in a low viscosity state so as to substantially planarize the surface topography and nevertheless reliably fill the corresponding openings 205a and 205b. In one illustrative embodiment, the fill layer 218 may be formed of photoresist that may have different optical characteristics compared to a resist mask 217 that is formed on the fill layer 218. The resist mask 217 may have formed therein a trench opening 217a, which substantially corresponds to the dimensions of a trench to be formed above the via opening 205a within an upper portion of the dielectric layer 205. Moreover, the resist mask 217 may also comprise a corresponding opening 217b that substantially corresponds to the underlying opening 205b.

The device 200 as shown in FIG. 2e may be formed according to the following process flow. First, the fill layer 218 may be formed by well-established spin-on techniques so as to reliably fill the openings 205a and 205b and also provide a sufficient layer thickness to yield a substantially planar topography. It should be noted that the material of the fill layer 218 is selected to provide optical characteristics which may significantly reduce back reflection into the resist mask 217 during an exposure process for patterning the resist mask 217 from an appropriate resist layer. Thus, in addition to an etch mask in a subsequent trench etch process, the layer 218 may also act as an ARC layer. Thereafter, a resist layer may be deposited which may be comprised of a resist material specifically designed for a specific exposure wavelength. The deposition may be performed on the basis of well-established spin-on techniques followed by specific pre-exposure bake processes. Thereafter, the resist layer may be exposed and may then be developed by a process 219, thereby forming the resist mask 217. The development or etch process 219 may be designed as a wet or dry development process for patterning the resist mask 217, wherein a subsequent anisotropic etch or development process may be performed to pattern the fill layer 218 on the basis of the resist mask 217. In one illustrative embodiment, the development process 219 is designed as a dry development process during which the fill layer 218 is also patterned to substantially completely remove the fill material from the opening 205b, while maintaining a plug of material within at least a portion of the via opening 205a.

Figure 2F:
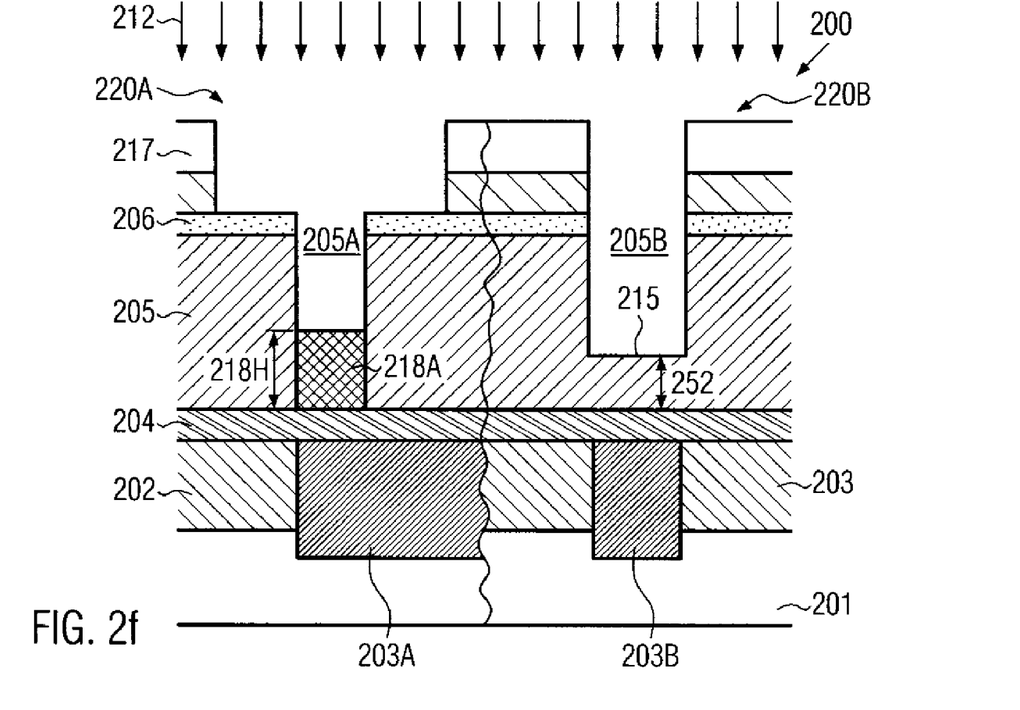

FIG. 2f schematically shows the device 200 after the completion of the patterning of the fill layer 218, irrespective of whether two or more development and/or etch steps may have been used or a single dry development process 219 is performed to pattern the resist mask 217 and the fill layer 218, when comprised of a photoresist material. After the process 219, which may include any additional etch processes for patterning the layer 218, when this layer is not comprised of a photoresist material, a bottom 215 of the opening 205b is substantially completely exposed, while a plug 218a is maintained within the via opening 205a, wherein the plug 218a has a height 218h that reliably prevents etching into the etch stop layer 204 in a subsequent trench etch process 212. The height 218h of the plug 218a may be controlled on the basis of process parameters of the process 219 and/or a subsequent anisotropic etch process for patterning the layer 218, wherein typically an etch rate within the via opening 205a may be reduced compared to the etch rate in the opening 205b so that the bottom 215 may reliably be exposed while a sufficient height 218h is maintained within the via opening 205a. In some embodiments, an end point detection may be performed for the process 219, in which the amount of certain volatile components may be monitored to detect a significant decrease of the volatile components caused by the substantially complete removal of the material 218 within the opening 205b, which may represent a significant portion of the entire material removed during the process 219.

During the subsequent anisotropic etch process 212, the bottom 215 may be exposed to the reactive etch ambient so as to further deepen the opening 205b, while an upper portion of the layer 205 is also etched so as to form a corresponding trench above the via opening 205a. Hence, during the etch process 212, the distance 252 is continuously reduced so that finally the bottom 215 approaches the etch stop layer 204.

Figure 2G:
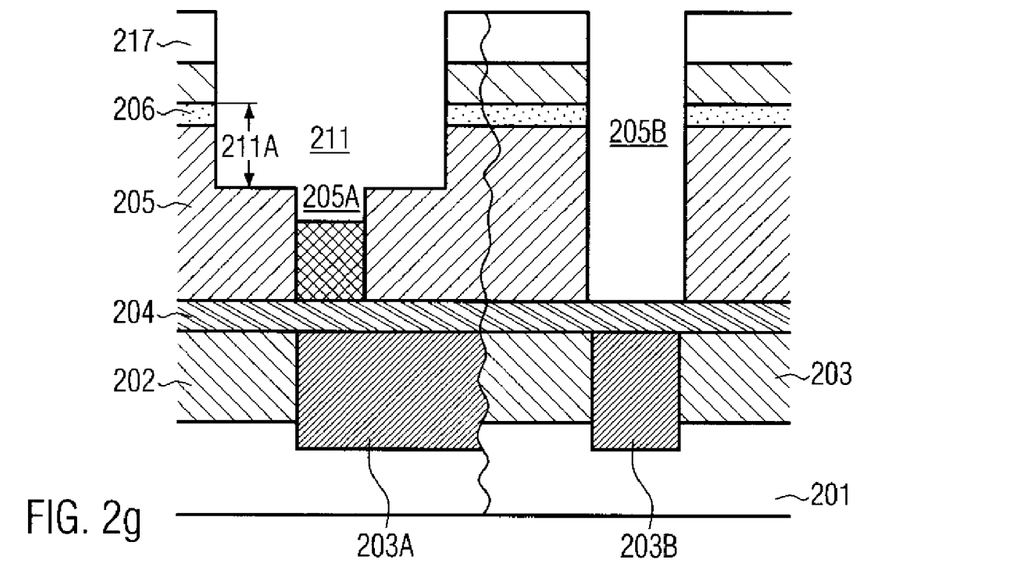

FIG. 2g schematically shows the device 200 after the completion of the anisotropic etch process 212. Consequently, a trench 211 is formed above the via opening 205a in the first die region 220a, while the opening 205b now extends down to the etch stop layer 204. As previously explained, preferably the distance 252 (see FIG. 2f) is selected in such a manner that the etch process 212 reliably reduces the distance 252 to zero, when a desired depth 211a of the trench 211 is achieved. In some embodiments, the initial distance 252 at the beginning of the etch process 212 is selected to be less than the target depth 211a of the trench 211. In this way it is ensured that the opening 205b will land on the etch stop layer 204 before a target depth 218a is reached, in particular as the ARC layer 206 has to be removed first in the trench 211, wherein this layer typically exhibits a reduced etch rate compared to the dielectric material of the layer 205. Thereafter, the resist mask 217, the remaining layer 218 including the plug 218a, may be removed and subsequently a further etch step may be performed to etch through the etch stop layer 204 and to provide contact of the via opening 205a and the opening 205b to the respective metal lines 203a and 203b.

Figure 2H:
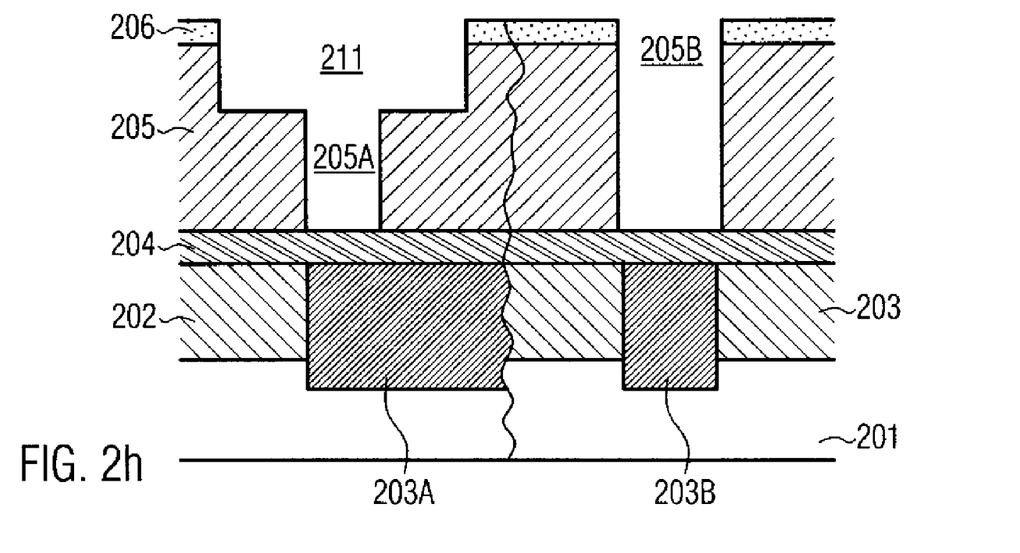

FIG. 2h schematically shows the semiconductor device 200 after the completion of the above-described process sequence. As a result, the dielectric layer 205 may be patterned in accordance with the damascene strategy for obtaining the via opening 205a and the trench 211 located thereabove within the first die region 220a, while the opening 205b, such as a trench, an open area and the like, is formed in the second die region 220b, wherein the probability for wafer arcing during the entire process sequence is significantly reduced compared to the conventional process flow, as is described with reference to FIGS. 1a-1c, and nevertheless a high degree of compatibility with the conventional process flow is maintained. As a consequence, the yield per substrate may be enhanced without unduly contributing to process complexity.

Figure 3A:
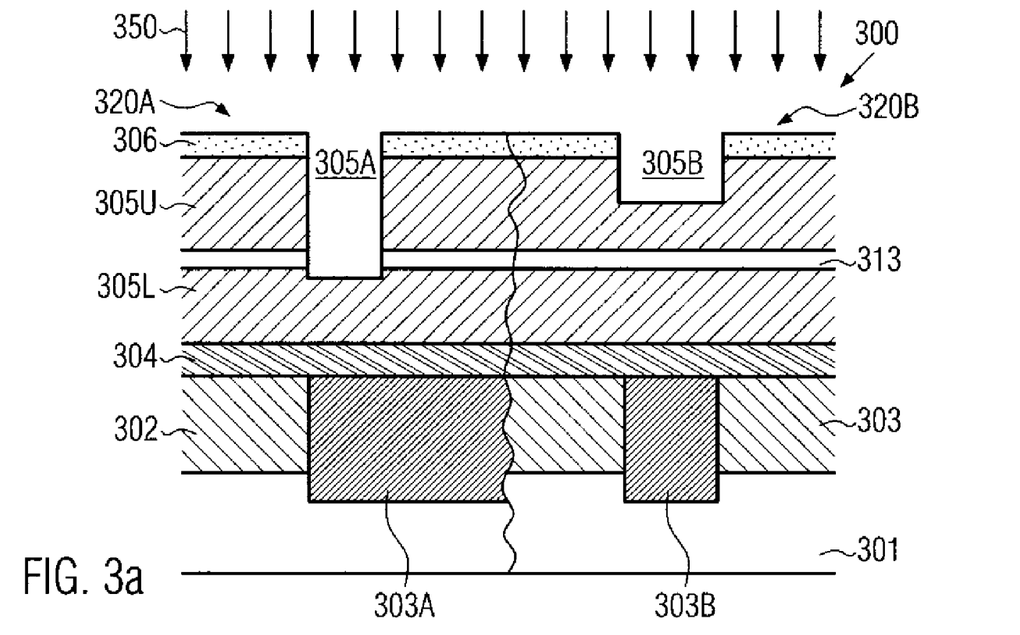
FIGS. 3a-3b schematically show cross-sectional views of a semiconductor device during the formation of via openings and delineation trenches, wherein the anisotropic etch process is at least partially controlled on the basis of an etch indicator layer in accordance with still further illustrative embodiments of the present invention.
Figure 3B:
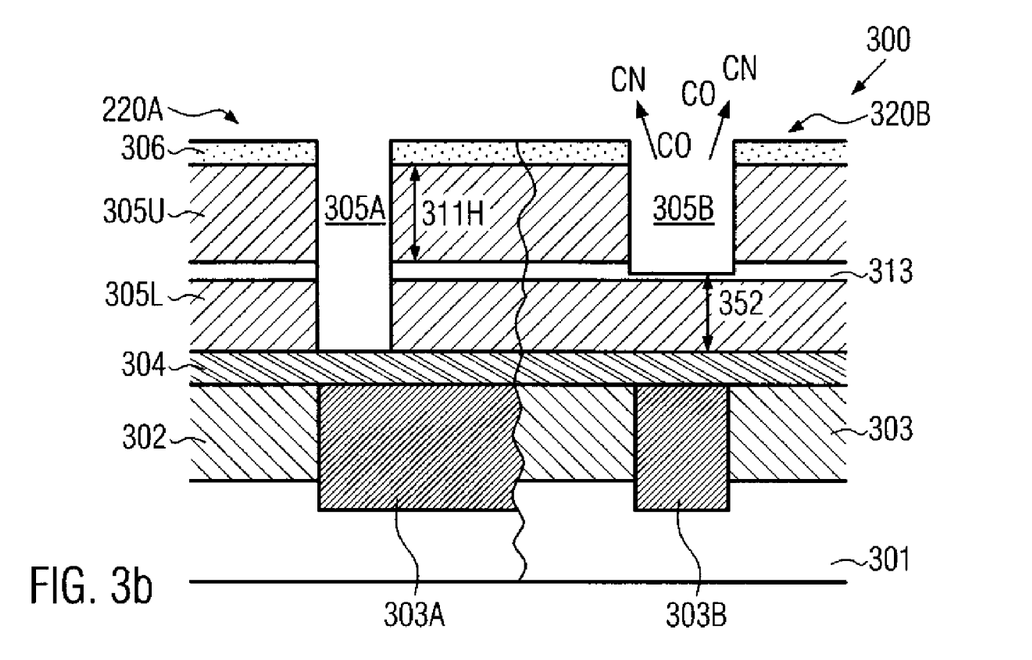

With reference to FIGS. 3a and 3b, further illustrative embodiments of the present invention will now be described in more detail, in which additional control strategies are provided for adjusting a reduced etch rate during the formation of via openings and corresponding delineation trenches or open areas in a common anisotropic etch process.

FIG. 3a schematically shows a semiconductor device 300 during the formation of a via opening 305a in a dielectric layer comprising an upper portion 305u and a lower portion 305*l* in a first die region 320*a*, while simultaneously an opening 305*b* is formed in a second die region 320*b*, which may represent a delineation region, an open area and the like. The device 300 further comprises a substrate 301 and a dielectric layer 302 in which may be formed metal lines 303*a* and 303*b*, which are covered by an etch stop layer 304. Moreover, the dielectric layer comprising the portions 305*u* and 305*l* is covered by an ARC or hard mask layer 306. The components of the device 300 may substantially correspond to the components as previously described with reference to FIGS. 2*a*-2*c*, wherein, in the embodiment shown, the layer 306 may substantially correspond to the hard mask as described with reference to FIG. 2*c*, whereas, in other embodiments (not shown), a corresponding resist mask may be provided to act as an etch mask during the etch process 350, as is for instance described with reference to FIG. 2*b*. The device 300 may further comprise an etch indicator layer 313, which may be formed of an appropriate material so as to release detectable volatile components as soon as the etch front of the process 350 reaches the etch indicator layer 313. In one illustrative embodiment, the dielectric layer comprising the portions 305*u* and 305*l* may substantially be comprised of SiCOH, while the etch indicator layer 313 may substantially be comprised of silicon dioxide. In such a configuration, high controllability of the etch process 350 is achieved, while nevertheless the overall low permittivity of the dielectric layer stack 305*u*, 303 and 305*l* is not unduly affected. In other embodiments, different materials for the portions 305*u* and 305*l* may be used in combination with any appropriate etch indicator material for the layer 313.

The device 300 as shown in FIG. 3*a* may be formed in accordance with processes similar to those already described with reference to FIGS. 1*a*-1*c* and 2*a*-2*c*, wherein an additional process step may be used for forming the etch indicator layer 313. For example, in some exemplary embodiments, after the deposition of the portion 305*l*, the layer 313 may be deposited by any appropriate deposition technique, such as PECVD deposition, and thereafter the portion 305*u* may be formed in accordance with well-established techniques. In one illustrative embodiment, the layer portions 305*l* and 305*u* and the etch indicator layer 313 are formed in an in situ process, that is, using the same deposition chamber without breaking the vacuum. In one embodiment, the portions 305*l* and 305*u* may be comprised of SiCOH formed in accordance with established deposition techniques with an intermediate step of slightly varied deposition parameters so as to deposit the etch indicator layer 313 in the form of a silicon dioxide layer with a thickness of approximately 20-50 nm.

Thereafter, the manufacturing process may be resumed in a similar manner as is already described with reference to FIGS. 2*a*-2*c* so as to form the patterned ARC layer 306, which, in the present embodiment, acts as a hard mask during the etch process 350. As previously described, the etch process 350 is designed such that a reduced etch rate is obtained at the opening 305*b* compared to the via opening 305*a* so that the corresponding etch front within the opening 305*b* is delayed with respect to that in the via opening 305*a*. During the progress of the etch process 350, the etch front in the via opening 305*a* may pass the etch indicator layer, thereby releasing a prominent volatile component, which may be, for instance, cyanide (CN) and carbon monoxide (CO), which may generate detectable optical transmission lines, when the gas ambient of the process 350 is monitored by spectroscopy. Thus, upon reaching the etch indicator layer 313, an increase of CN and CO molecules may be detected, thereby indicating the position of the etch front related to the via opening 305*a*. During the further etch process 350, the signal obtained by the CN and CO molecules may significantly decrease, when the etch front within the via opening 305*a* now advances into the lower portion 305*l*, while the etch front within the opening 305*b* has still not reached the etch indicator layer 313. When the etch front in the opening 305*a* may reach the etch stop layer 304, the etch front may substantially be stopped on or within the layer 304, while the etch front in the opening 305*b* still moves on and finally reaches the etch indicator layer 313, which may then reliably be detected due to the significant increase of the end point detection signal generated by the CN and CO molecules.

FIG. 3*b* schematically shows the device 300 in this situation. Depending on the location of the etch indicator layer 313, the etch process 350 may be discontinued when the location of the layer 313 substantially corresponds to a target distance 352, which is appropriate for a subsequent etch process for forming a trench above the via opening 305*a*, as is also explained with reference to FIGS. 2*b*-2*e*. In other embodiments, the location of the etch indicator layer 313 may substantially correspond to a depth 311*h* of a trench to be formed above the via opening 305*a* and thus the etch process 350 may still be continued after the passage of the etch indicator layer 313 within the opening 305*b*. Nevertheless, the passage of the etch indicator layer 313 by the etch fronts in the via opening 305*a* and the opening 305*b* may provide an enhanced controllability, since the actual delay of these etch fronts may be determined on the basis of the corresponding spectroscopic signals. For example, if measurement results indicate a significant delay between these two signals, the etch process 350 may be continued, even if the opening 305*a* has already reached the etch stop layer 304, until the desired target distance 352 is reached within the opening 305*b*. The corresponding over-etch time may be calculated on the basis of the previously obtained spectroscopic signals. Similarly, if the location of the etch indicator layer 313 substantially corresponds to the depth 311*h*, an appropriate over-etch time may be derived from the corresponding signal, that is, from the signal obtained when the etch front in the opening 305*b* passes the etch indicator layer 313, so as to reach the target distance 352 with high precision, wherein the etch indicator layer 313 may also allow enhanced controllability of a subsequent etch process for forming a trench down to the depth 311*h*.

After the common etch process 350, the further processing may be resumed as is already described with reference to FIGS. 2*e*-2*h*. That is, in a subsequent common etch process, the corresponding trench may be formed, while the opening 305*b* is etched down to the etch stop layer 304, wherein a correspondingly designed fill material plug protects the via opening 305*a* while exposing the opening 305*b*. Consequently, the process of forming the via opening 305*a* and the opening 305*b* may be performed with enhanced control flexibility while nevertheless reducing the risk of wafer charging and wafer arcing, as is the case in the conventional process flow.

As a result, the present invention provides a technique that enables the formation of via openings and delineation trenches and open areas in a metallization layer, wherein, in a first common etch process, the via openings are etched down to the corresponding etch stop layer, while the etch front in the delineation trench or open area is significantly delayed, which may reduce the probability for wafer arcing and wafer charging. The opening of the delineation trench and/or open area may be completed during a subsequent common etch process, in which a trench is formed above the via opening, thereby avoiding undue process complexity. For this purpose, the process for patterning a fill layer or under-layer is designed such that the via opening is protected by an appropriate plug, while the opening of the delineation trench and/or open area is substantially exposed during the trench etch process, thereby allowing a further deepening of this opening while the trench is formed above the via opening.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a via opening and a delineation area in a dielectric layer of a metallization layer in a first common etch process, said first common etch process being designed to have a first etch rate at said via opening and having a second reduced etch rate at said delineation area;
    discontinuing said first common etch process when said via opening reaches an etch stop layer located below said dielectric layer; and
    forming a trench in an upper portion of said dielectric layer that connects to said via opening and further deepening said delineation area so as to extend to said etch stop layer in a second common etch process.

2. The method of claim 1, further comprising etching through said etch stop layer in said via opening and said delineation area in a third common etch process.

3. The method of claim 1, wherein forming said via opening and said delineation area comprises:
    forming an anti-reflective coating above said dielectric layer;
    forming a resist mask above said anti-reflective coating; and
    etching said anti-reflective coating and said dielectric layer with said resist mask acting as an etch mask.

4. The method of claim 1, wherein forming said via opening and said delineation area comprises:
    forming a hard mask layer above said dielectric layer;
    forming a resist mask above said hard mask layer;
    etching said hard mask layer with said resist mask acting as a first etch mask to form a hard mask;
    removing said resist mask; and
    etching said dielectric layer with said hard mask acting as a second etch mask.

5. The method of claim 1, wherein forming said trench comprises:
    depositing a fill material to form a fill layer above said via opening and said delineation area; and
    patterning said fill material by a means of a resist mask representing said trench.

6. The method of claim 5, wherein patterning said fill layer comprises removing fill material from said delineation area while preserving a plug of said fill material in said via opening, said plug acting as an etch mask.

7. The method of claim 6, wherein said fill material comprises a photoresist.

8. The method of claim 7, wherein removing fill material comprises forming a resist layer above said fill layer, exposing said resist layer and dry-developing said exposed resist layer and said fill layer.

9. The method of claim 8, wherein dry-developing said exposed resist layer comprises controlling at least one process parameter so as to obtain a reduced removal rate at said delineation area relative to said via opening.

10. The method of claim 8, wherein dry-developing said resist layer and said fill layer comprises determining an end point of said dry-develop process that defines a substantially exposed state of a bottom of said delineation area as formed after said first common etch process.

11. The method of claim 1, wherein said dielectric layer comprises a low-k material.

12. The method of claim 1, wherein said delineation area comprises a trench defining a boundary for a die region.

13. The method of claim 1, further comprising forming an etch indicator layer in said dielectric layer and controlling said first common etch process on the basis of said etch indicator layer.

14. The method of claim 13, wherein said etch indicator layer is positioned at a depth that substantially corresponds to a depth of said trench.

15. A method, comprising:
    establishing an etch recipe for a first common etch process for forming a via opening and at least one of a delineation trench and an open area in an interlayer dielectric of a metallization layer of a specified type of semiconductor device, said first common etch process being designed to have a first etch rate at said via opening and having a second reduced etch rate at said at least one of a delineation trench and an open area;
    forming on one or more substrates said via opening and said at least one of a delineation trench and an open area on the basis of said established process recipe;
    discontinuing said first common etch process when said via opening reaches an etch stop layer located below said dielectric layer; and
    forming a trench in an upper portion of said dielectric layer that connects to said via opening and further deepening said at least one of a delineation trench and an open area so as to extend to said etch stop layer in a second common etch process.

16. The method of claim 15, further comprising etching through said etch stop layer in said via opening and said at least one of a delineation trench and an open area in a third common etch process.

17. The method of claim 15, wherein forming said via opening and said at least one of a delineation trench and an open area comprises:
    forming an anti-reflective coating above said dielectric layer;
    forming a resist mask above said anti-reflective coating; and
    etching said anti-reflective coating and said dielectric layer with said resist mask acting as an etch mask.

18. The method of claim 15 wherein forming said via opening and said at least one of a delineation trench and an open area comprises:
    forming a hard mask layer above said dielectric layer;
    forming a resist mask above said hard mask layer;
    etching said hard mask layer with said resist mask acting as a first etch mask to form a hard mask;
    removing said resist mask; and
    etching said dielectric layer with said hard mask acting as a second etch mask.

19. The method of claim 15 wherein forming said trench comprises:
depositing a fill material to form a fill layer above said via opening and said at least one of a delineation trench and an open area; and
patterning said fill material by a means of a resist mask representing said trench.

20. The method of claim 19, wherein patterning said fill layer comprises removing fill material from said at least one of a delineation trench and an open area while preserving a plug of said fill material in said via opening, said plug acting as an etch mask.

21. The method of claim 20, wherein said fill material comprises a photoresist.

22. The method of claim 21, wherein removing fill material comprises forming a resist layer above said fill layer, exposing said resist layer and dry-developing said exposed resist layer and said fill layer.

23. The method of claim 22, wherein dry-developing said exposed resist layer comprises controlling at least one process parameter so as to obtain a reduced removal rate at said delineation trench relative to said via opening.

24. The method of claim 22, wherein dry-developing said resist layer and said fill layer comprises determining an end point of said dry-develop process that defines a substantially exposed state of a bottom of said at least one of a delineation trench and an open area as formed after said first common etch process.

25. The method of claim 15, wherein said dielectric layer comprises a low-k material.

26. The method of claim 15, further comprising forming an etch indicator layer in said dielectric layer and controlling said first common etch process on the basis of said etch indicator layer.

27. The method of claim 26, wherein said etch indicator layer is positioned at a depth that substantially corresponds to a depth of said trench.

28. The method of claim 1, further comprising providing at least one precursor gas during said first common etch process to generate an etch inhibitor layer, said etch inhibitor layer reducing the second reduced etch rate relative to the first etch rate.

29. The method of claim 1, further comprising providing at least one precursor gas during said first common etch process to generate an etch inhibitor layer, said etch inhibitor layer reducing the second reduced etch rate relative to the first etch rate.

* * * * *